US009972695B2

(12) United States Patent
Narayanan et al.

(10) Patent No.: US 9,972,695 B2
(45) Date of Patent: May 15, 2018

(54) BINARY METAL OXIDE BASED INTERLAYER FOR HIGH MOBILITY CHANNELS

(71) Applicants: INTERNATIONAL BUSINESS MACHINES CORPORATION, Armonk, NY (US); ULVAC, Inc., Kanagawa (JP)

(72) Inventors: Vijay Narayanan, New York, NY (US); Yohei Ogawa, White Plains, NY (US); John Rozen, Hastings on Hudson, NY (US)

(73) Assignees: INTERNATIONAL BUSINESS MACHINES CORPORATION, Armonk, NY (US); ULVAC, INC., Kanagawa (JP)

( * ) Notice: Subject to any disclaimer, the term of this patent is extended or adjusted under 35 U.S.C. 154(b) by 0 days. days.

(21) Appl. No.: 15/228,160

(22) Filed: Aug. 4, 2016

(65) Prior Publication Data

US 2018/0040708 A1    Feb. 8, 2018

(51) Int. Cl.
*H01L 29/51* (2006.01)
*H01L 21/306* (2006.01)
(Continued)

(52) U.S. Cl.
CPC ........ *H01L 29/513* (2013.01); *H01L 21/0228* (2013.01); *H01L 21/02043* (2013.01);
(Continued)

(58) Field of Classification Search
CPC ............ H01L 29/513; H01L 21/02043; H01L 21/02186; H01L 21/02194;
(Continued)

(56) References Cited

U.S. PATENT DOCUMENTS

| 6,383,873 | B1* | 5/2002 | Hegde | ............... H01L 21/28185 |
| | | | | 438/287 |
| 2011/0024845 | A1* | 2/2011 | Hirai | ................. H01L 21/28079 |
| | | | | 257/369 |

(Continued)

FOREIGN PATENT DOCUMENTS

| CN | 101752236 A | 6/2010 |
| CN | 102403367 A | 4/2012 |
| WO | 2013/155432 A2 | 10/2013 |

OTHER PUBLICATIONS

Profijt, H.B. et al., "Plasma-Assisted Atomic Layer Deposition: Basics, Opportunities, and Challenges" J. Vac. Sci. Technol. A (Sep./Oct. 2011) pp. 050801-1-050801-26, vol. 29, No. 5.

*Primary Examiner* — Mouloucoulaye Inoussa
(74) *Attorney, Agent, or Firm* — Tutunjian & Bitetto, P.C.; Vazken Alexanian (57) ABSTRACT

A method of forming a gate stack that includes treating a semiconductor substrate with a wet etch chemistry to clean a surface of the semiconductor substrate and form an oxide containing interfacial layer, and converting the oxide containing interfacial layer to a binary alloy oxide based interlayer using a plasma deposition sequence including alternating a metal gas precursor and a nitrogen and/or hydrogen containing plasma. The method of forming the gate stack may further include forming a high-k dielectric layer atop the binary alloy oxide based interlayer.

15 Claims, 9 Drawing Sheets

(51) Int. Cl.
*H01L 21/02* (2006.01)
*H01L 29/66* (2006.01)
*H01L 29/20* (2006.01)
*H01L 29/78* (2006.01)
*H01L 21/28* (2006.01)
*H01L 29/423* (2006.01)
*H01L 29/06* (2006.01)

(52) U.S. Cl.
CPC .. *H01L 21/02178* (2013.01); *H01L 21/02186* (2013.01); *H01L 21/02194* (2013.01); *H01L 21/02205* (2013.01); *H01L 21/02274* (2013.01); *H01L 21/02307* (2013.01); *H01L 21/28264* (2013.01); *H01L 21/30612* (2013.01); *H01L 29/20* (2013.01); *H01L 29/42364* (2013.01); *H01L 29/518* (2013.01); *H01L 29/66522* (2013.01); *H01L 29/78* (2013.01); *H01L 29/0669* (2013.01); *H01L 29/7827* (2013.01); *H01L 29/7851* (2013.01)

(58) Field of Classification Search
CPC ......... H01L 21/02205; H01L 21/02274; H01L 21/0228; H01L 21/28264; H01L 21/30612; H01L 29/20; H01L 29/42364; H01L 29/518; H01L 29/66522; H01L 29/78; H01L 23/5256; H01L 21/02178; H01L 21/02277; H01L 29/517; C23C 16/403; C23C 16/4488; C23C 16/30; C23C 16/44; C23C 16/50; B05D 1/60; B05D 1/62; C09D 4/00; G11B 7/254; G11B 7/2542; C08G 77/04
USPC ........... 438/287, 240, 3, 528, 558, 591, 601; 257/76, E29.165, 529
See application file for complete search history.

(56) References Cited

U.S. PATENT DOCUMENTS

2013/0270655 A1* 10/2013 Adam ............... H01L 29/66545
257/410
2015/0376788 A1* 12/2015 Zhou ................. C23C 16/45574
118/723 R

* cited by examiner

BINARY METAL OXIDE BASED INTERLAYER FOR HIGH MOBILITY CHANNELS

FIELD OF THE INVENTION

The present disclosure relates generally to semiconductor devices, and more particularly to forming interlayers used in conjunction with gate structures in semiconductor devices.

BACKGROUND

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling), as well as improvements in device performance in terms of device switching speed and power consumption.

SUMMARY

In one aspect of the present disclosure, a method is provided for forming a metal oxide based interlayer, e.g., binary metal oxide based interlayer. In some embodiments, the method of forming the binary alloy oxide based interlayer may include treating a semiconductor substrate with a wet chemical etchant to clean a surface of the semiconductor substrate and form an oxide containing interfacial layer on the semiconductor substrate. The method may further include converting the oxide containing interfacial layer to a binary alloy oxide using a plasma deposition sequence including alternating a metal gas precursor and a plasma selected from the group consisting of hydrogen, nitrogen or a combination thereof.

In another aspect, a method of forming a gate stack is provided that includes a metal oxynitride interlayer, e.g., binary metal oxynitride interlayer. In some embodiments, the method of forming the gate stack includes treating a semiconductor substrate with a wet etch chemistry to clean a surface of the semiconductor substrate and form an oxide containing interfacial layer on the surface of the semiconductor substrate. The method may continue with converting the oxide containing interfacial layer to a binary alloy oxide based interlayer using a plasma deposition sequence including alternating a metal gas precursor and a plasma selected from the group consisting of hydrogen, nitrogen or a combination thereof. Thereafter, a high-k dielectric layer is formed atop the binary alloy oxide-based interlayer. This step can be performed in-situ with the binary alloy oxide-based interlayer formation.

In another aspect, the present disclosure provides a gate structure to a semiconductor device including a metal oxynitride interlayer, e.g., binary metal oxynitride interlayer. In some embodiments, the semiconductor device includes a channel region of a semiconductor substrate composed of a type III-V semiconductor material, and a gate structure including an interlayer that is present atop the channel region. The interlayer may be composed of at least one of oxygen and nitrogen, and a metal selected from the group consisting of aluminum, titanium, and a combination thereof. In some embodiments, the gate structure may further include a high-k dielectric layer directly atop the interlayer. The semiconductor device may further include source and drain regions on opposing sides of the channel region. The semiconductor device may include 2D and 3D channel architectures including FIN structures, nanowires, vertical field effect transistors FETs and nanosheets.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is related to semiconductor devices, such as field effect transistors. A "field effect transistor" is a transistor in which output current, i.e., source-drain current, is controlled by the voltage applied to a gate structure. A field effect transistor typically has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields. The gate structure typically includes at least one gate dielectric and at least one gate conductor. As used herein, a "gate dielectric" is a layer of an insulator between the semiconductor device substrate of a planar device, or fin structure, and the gate conductor. A "gate conductor" means a conductive structure of the gate structure on the gate dielectric. The field effect transistors (FETs) that are used with the methods and structures provided herein may include planar field effect transistors, planar field effect transistors on bulk substrates, planar field effect transistors on SOI substrates, partially depicted field effect transistors, fully depleted field effect transistors, Fin Field Effect Transistors (FinFETs), nanowire field effect transistors, trigate field effect transistors, horizontal nanowire or nano-sheet semiconductor devices, or vertical nanowire or nanosheets semiconductor devices.

It has been determined that the poor quality of the native oxide of high-mobility channel yield limited scaling, low mobility and poor transfer characteristics in MOSFET devices. The native oxide may be referred to as the interlayer between the gate dielectric of a gate structure and the channel region of semiconductor material of a semiconductor device. It has been determined that wet treatment of this interface offer limited options due to the fast re-growth when exposed to ambient air and the queue time dependence make results non-predictive. For example, a wet chemical treatment, e.g., WETs, may include the application of ammonia ($NH_4OH$) followed by ammonium sulfide ($NH_4$)2S to etch native oxides from the semiconductor surface and to passivate the surface, but this method can yield sulfur (S) contamination of gate deposition tool. Additionally, the surface remains unstable, therefore incorporating oxygen (O) within minutes. Forming a silicon (Si) interfacial layer, i.e., in-situ Si IL, silicon (Si) by molecular beam epitaxy (MBE) or plasma enhanced chemical vapor deposition (PECVD) can eliminate the formation of native oxide, but the low-k dielectric of the deposited silicon (Si), and the necessary thickness to induce subsequent nucleation prevents aggressively of the interfacial layer formed by this method. It has also been determined that forming an aluminum oxynitride (AlON) interfacial layer, i.e., in-situ AlON IL, by conversion of the interfacial layer post buffered oxide etch (BOE) WETs, promotes scaling to as low as 13 Å capacitance equivalent thickness (CET) when topped with hafnium dioxide ($HfO_2$), but still shows some significant hysteresis and potential reliability penalty. Depositing an interfacial layer of titanium oxynitride, i.e., in-situ TiON IL, by conversion of the IL post buffered oxide etch (BOE) WETs has been shown to promote very aggressive scaling, i.e., less than 10 Å capacitance equivalent thickness (CET), but the interface quality is bad and long channel mobility is an order of magnitude of what can be achieved with Al-containing interfaces.

As will be discussed in greater detail below, the methods disclosed herein can provide a binary metal oxide based interlayer using a process sequence that can include treating a semiconductor substrate with a wet chemical etchant to provide a oxide containing interfacial layer; and converting the oxide containing interfacial layer to a binary metal oxide based interlayer using a plasma deposition sequence including alternating a metal gas precursor and a plasma species selected from nitrogen, hydrogen or a combination thereof. In some embodiments, the methods disclosed herein provide in-situ interface control of high-mobility substrates by decoupling a wet chemical etch (WET), such as a wet etch including hydrochloric (HCl), ammonia ($NH_4OH$), buffered oxide etch (BOE) and a combination thereof, and converting the poor interfacial layer (IL) to a high quality material of a titanium aluminum oxynitride (TiAlON) having a thickness of approximately 15 Å at temperature of about 400° C. or less, which is compatible with the aforementioned material. Thereafter, by depositing a high-k material (in-situ), such as hafnium dioxide ($HfO_2$) (at a thickness of ~25 Å) at 300° C., on the interfacial layer that has been converted to high quality titanium aluminum oxynitride (TiAlON), the methods disclosed herein can obtain a capacitance equivalent thickness (CET) as low as 10 Å, with low leakage, small hysteresis, and good interface quality. In some embodiments, titanium (Ti) doping of AlON boosts the k-value, which can provide a reduction of approximately 5 Å in the capacitance equivalent thickness (CET) at same leakage. Excellent nucleation of the subsequent dielectric has been observed. The methods and structures of this embodiment are now described with greater detail referring to FIGS. 1-13.

Figure 1:
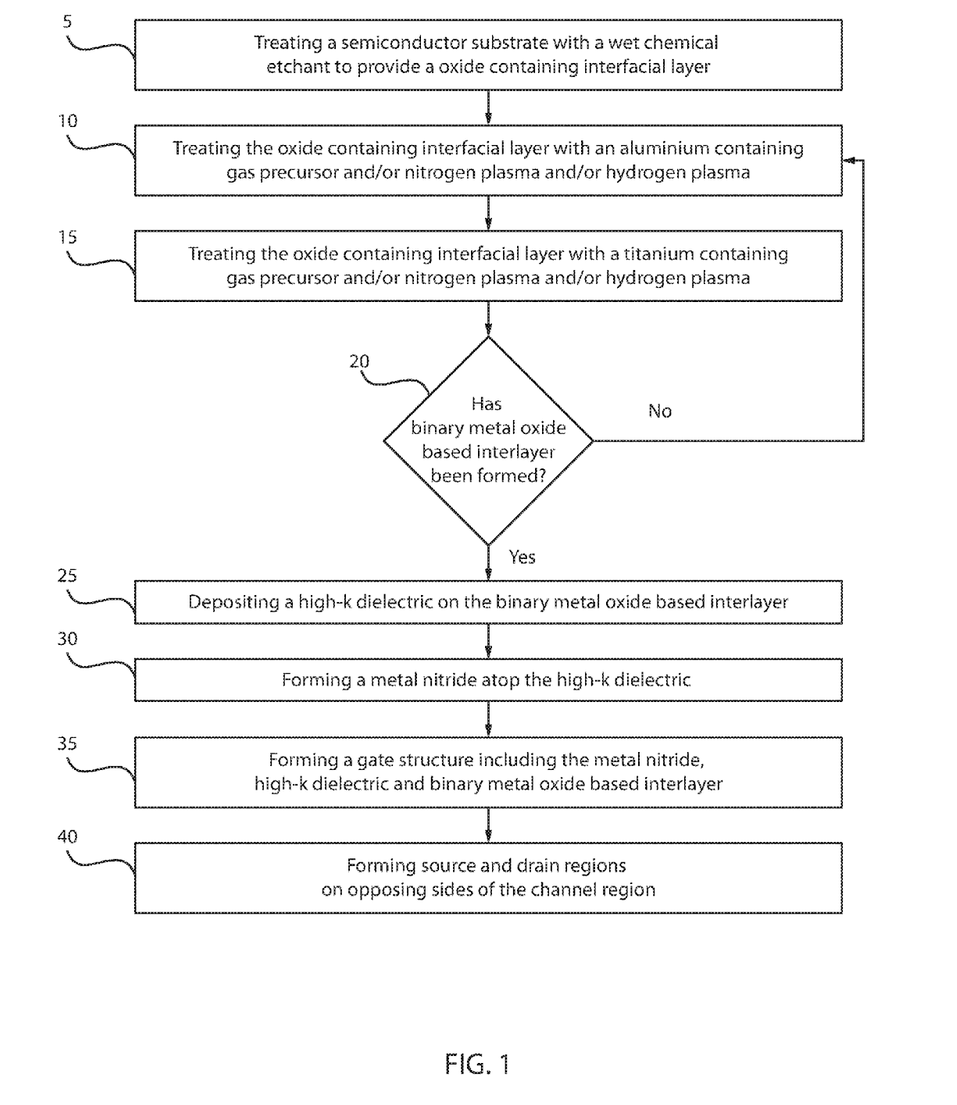
FIG. 1 is a flow chart illustrating one embodiment of a gate first method for forming a semiconductor device that includes a binary metal oxide based interlayer on a III-V semiconductor substrate, in accordance with one embodiment of the present disclosure.
Figure 2:
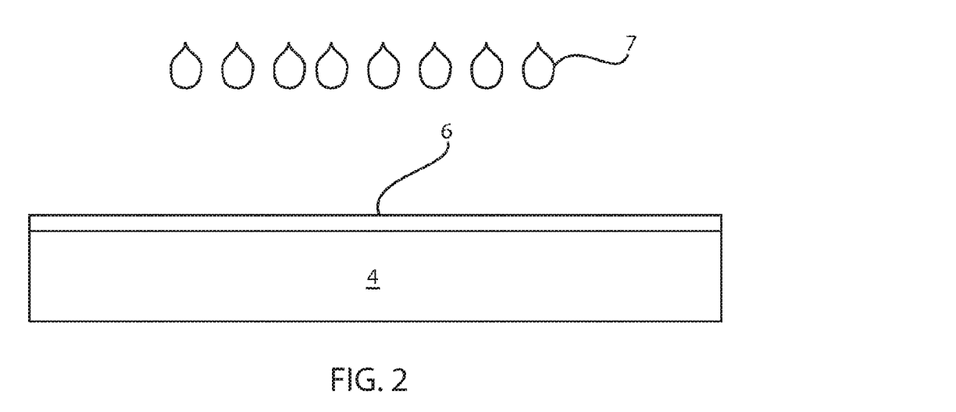
FIG. 2 is a side cross-sectional view depicting one embodiment of applying a wet chemical etch to a III-V semiconductor channel region of a substrate to form an oxide containing interfacial layer, in accordance with the present disclosure.

FIG. 1 is a flow chart illustrating one embodiment of a gate first method for forming a semiconductor device 100a that includes a binary metal oxide based interlayer on a III-V semiconductor substrate. The term "binary" denotes that the metal oxide based interlayer includes at least two metal elements, e.g., titanium (Ti) and aluminum (Al). The term "oxide based" means that the interlayer includes oxygen (O). The method may begin with step 5 which includes treating a semiconductor substrate 4 with a wet etch chemistry to provide a oxide containing interfacial layer 6, as depicted in FIG. 2. In some embodiments, the wet etch chemistry cleans the surface of the semiconductor substrate 4, in which the oxide containing interfacial layer 6 is formed as a result of an air exposure, i.e., oxygen containing atmosphere exposure, to the cleaned semiconductor substrate surface. Referring to FIG. 2, the III-V semiconductor substrate is composed of a III-V semiconductor material. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate 1 may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. In one example, the III-V substrate 1 may be composed of aluminum gallium arsenide (AlGaAs) in a bulk semiconductor substrate configuration. Although FIGS. 2-7 depict a planar semiconductor device formed on a bulk substrate, the present disclosure is not limited to only this example. For example, the III-V semiconductor substrate 4 may be a semiconductor on insulator (SOI) substrate, e.g., silicon on insulator substrate, extremely thin semiconductor on insulator (ETSOI) substrate, or the semiconductor substrate 4 may be a fin type structures, such as a fin type structure employed in Fin Field Effect Transistors (FinFETs). Other non-planar structures include vertical FETs, nanowires and nanosheets. The III-V channel material might sit on a buffer that can be required for epitaxy deposition.

FIG. 2 also depicts forming an interfacial oxide material 6 on an III-V semiconductor channel region, e.g., as provided by a III-V semiconductor substrate 4. In one embodiment, the interfacial oxide material 6 may be composed of arsenic oxide. It is noted that arsenic oxide is only one example of the interfacial oxide material 6 that can be used at this step of the present disclosure, and it is not intended that the interfacial oxide material 6 be limited to only this example. For example, the interfacial oxide material 6 may also be composed of gallium oxide, indium oxide or combinations thereof including combinations with arsenic oxide. The interfacial oxide material 6 may be formed by applying a wet chemical etchant 7 to the surface of the semiconductor substrate 1, which is followed by air exposure, enabling subsequent oxygen insertion. In some embodiments, the wet chemical etchant may include hydrochloric acid (HCl), ammonium hydroxide ($NH_4OH$), or a buffered oxide etch (BOE). Buffered oxide etch (BOE), also known as buffered HF or BHF, is a mixture of a buffering agent, such as ammonium fluoride ($NH_4F$), and hydrofluoric acid (HF). A common buffered oxide etch solution comprises a 6:1 volume ratio of 40% $NH_4F$ in water to 49% HF in water. In some embodiments, HCl may be added to BHF solutions in order to produce a higher quality etch.

In one embodiment, treating the semiconductor substrate 4 with the wet chemical etchant may include a two stage treatment including a first surface treatment with ammonium hydroxide ($NH_4OH$) followed by a second surface treatment with ammonium sulfide ($NH_4)_2S$.

The wet chemical etchant 7 may be applied at room temperature, e.g., 20° C. to 25° C., or the wet chemical etchant 7 may be applied at an elevated temperature, which can be as great as about 400° C. For some examples, the wet chemical etchant 7 may be applied at a temperature ranging from 20° C. to 80° C. The time period that the wet chemical etchant 7 is applied to the semiconductor substrate ranges from 30 seconds to 5 minutes.

In one embodiment, the thickness of the interfacial oxide material 6 may range from 1 Å to 10 Å. In some embodiments, the thickness of the interfacial oxide material 6 may range from 2 Å to 5 Å.

The interfacial oxide material 6 may be referred to as having a poor quality. The term "poor quality" as used herein to describe the interfacial oxide material 6 that is formed by the application of the wet chemical etchant 7 to the semiconductor substrate 4 denotes that the oxide material has a high density of electrically active defects, quantified for example by Density of Interface States ($D_{IT}$), negatively impacting the transport properties of FET stacks that include such layer, quantified for example by the channel mobility and the sub-threshold slope.

Figure 3:
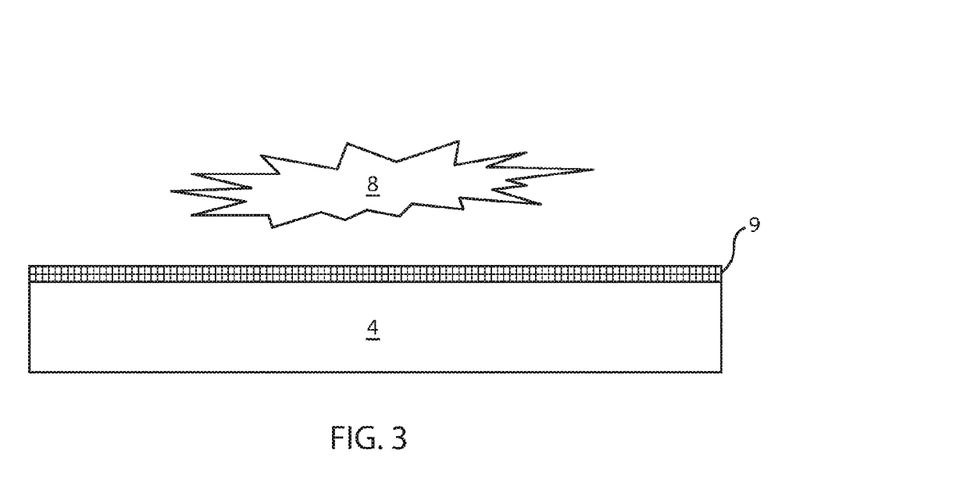
FIG. 3 is a side cross-sectional view depicting one embodiment of converting the oxide containing interfacial layer to a binary metal oxide based interlayer using a plasma deposition sequence including alternating a metal gas precursor and a plasma of nitrogen or hydrogen, in accordance with one embodiment of the present disclosure.

Referring to FIG. 1, in a following sequence of steps, the interfacial oxide material 6 may be converted from a poor interfacial layer into a high quality binary metal oxide based interlayer 9 for high mobility channels by employing alternating super cycles of metal precursors and nitrogen and/or hydrogen containing gases. FIG. 3 depicts one embodiment of converting the interfacial oxide material 6 to a binary metal oxide based interlayer 9 using a plasma including deposition 8 including alternating a metal gas precursor for a metal source and a nitrogen containing plasma for a nitrogen source in forming a binary metal oxynitride interlayer 9. This is repeated with super cycles using 2 metal sources to form the binary metal oxide. In one embodiment, the binary metal oxide interlayer 9 is composed of an aluminum, titanium and oxygen containing composition. In another embodiment, the binary metal oxide interlayer 9 is composed of an aluminum, titanium, oxygen and nitrogen containing composition. For example, the high quality metal oxynitride interlayer 9 may be composed of titanium aluminum oxynitride (TiAlON).

Referring to FIG. 1, the conversion of the interfacial oxide material 6 to the high quality binary metal oxide interlayer 9 may begin with placing the structure depicted in FIG. 2 in the deposition chamber of an atomic layer deposition (ALD) apparatus that may include a remote plasma producing chamber. "Atomic layer deposition" (ALD) as used herein refers to a vapor deposition process in which numerous consecutive deposition cycles are conducted in a deposition chamber. Typically, during each cycle a metal precursor is chemisorbed to the substrate surface, i.e., surface of the low-k dielectric material 30; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. The adsorbed species are bound to the deposition surface as a result of relatively strong binding forces characterized by high adsorption energies (>30 kcal/mol), comparable in strength to ordinary chemical bonds. In some embodiments, the chemisorbed species are limited to the formation of a monolayer on the deposition surface. In atomic layer deposition (ALD), one or more appropriate reactive precursor compounds are alternately introduced (e.g., pulsed) into a deposition chamber and chemisorbed onto the deposition surface. Each sequential introduction of a reactive precursor compound is typically separated by an inert carrier gas purge. Each precursor compound co-reaction adds a new atomic layer to previously deposited layers to form a cumulative solid layer. Atomic layer deposition (ALD) can use one precursor compound and one reaction gas. In particular, when a plasma gas is used as a reactant, the method is referred to as plasma-enhanced atomic layer deposition (PEALD).

In some embodiments, the ALD apparatus used to form the metal oxynitride interlayer 9 may include a plasma source that is remote from the deposition chamber for providing the nitrogen source. As used herein, the term "plasma" denotes a state of matter similar to gas in which a certain portion of the particles are ionized. From a purely thermal standpoint, heating a gas sufficiently can cause a phase change to the plasma state. As such, sufficiently heating a gas will ionize its molecules or atoms (reduce or increase the number of electrons in them), thus inducing a phase change to a plasma, which contains charged particles: positive ions and negative electrons or ions. A plasma can be fully ionized, or partially ionized. Ionization can be induced by nonthermal means, such as strong electromagnetic fields, and can be accompanied by the dissociation of molecular bonds, if present. Plasma apparatus disclosed herein may be referred to as a "remote exposure" type treatment. The remote exposure (RE) plasma method utilizes only the reactive species generated by the plasma to treat the deposition surface which is present in a deposition chamber that is connected to but separated from a chamber in which the plasma is formed. The chamber in which the plasma is generated and the deposition chamber may be connected by any passageway through which the nitrogen containing reactive species produced by the plasma can travel to reach the deposition surface.

Referring to steps 10 and 15 of the method depicted in FIG. 1, in some embodiments, the sequence employed that converts the oxide containing interfacial layer 6 to a binary metal oxide based interlayer 9 includes alternating different metal gas precursor and plasma combinations, e.g., nitrogen based plasma, hydrogen based plasma, or a combination of nitrogen and hydrogen based plasmas. For example, when forming a binary metal oxide based interlayer 9 that is composed of titanium and aluminum in combination with oxygen and nitrogen, the metal gas precursors may include a titanium gas precursor and an aluminum gas precursor, in which each of the titanium and aluminum gas precursors may be accompanies by the application of a nitrogen source from the plasma, and each of the titanium and aluminum gas precursors may be sequenced in an alternating manner. Some examples of metal gas precursors containing aluminum may include trimethyl aluminum (TMA), triethylaluminium (TEAL) or a combination thereof. Some examples of metal gas precursors containing titanium may include tetrakis(dimethylamino)titanium (TDMAT), titanium tetrachloride ($TiCl_4$) and combinations thereof. Some examples of nitrogen containing plasmas may include $NH_3$ plasma, $N_2$ plasma and a combination thereof. In some embodiments, the temperature of the treatment, i.e., metal gas precursor and nitrogen plasma treatment, that converts the interfacial oxide material 6 from a poor interfacial layer into a high quality binary metal oxide based interlayer 9 is not greater than 400° C. In some embodiments, the temperature of the treatment, i.e., metal gas precursor and nitrogen plasma treatment, that converts the interfacial oxide material 6 from a poor interfacial layer into a high quality metal oxynitride interlayer 9, e.g., binary oxynitride interlayer, may range from room temperature, e.g., 20° C. to 25° C., to 400° C. In another embodiment, the temperature of the treatment, i.e., metal gas precursor and nitrogen plasma treatment, that converts the interfacial oxide material 6 from a poor interfacial layer into a high quality binary metal oxide based interlayer 9 may range from 250° C. to 350° C.

Referring to step 10 of the method depicted in FIG. 1, in some embodiments, the sequence that converts the oxide containing interfacial layer 6 to a binary metal oxide based interlayer 9 may begin with treating the oxide containing interfacial layer with an aluminum containing gas precursor and/or a nitrogen plasma and/or a hydrogen plasma in a first cycle. The relative order of precursor exposure might vary, including cycle to cycle. The first cycle may produce aluminum nitride (AlN), and may include metal gas precursors containing aluminum, such as trimethyl aluminum (TMA), triethylaluminium (TEAL) or a combination thereof, and/or a nitrogen source, such as $NH_3$ plasma, $N_2$ plasma or a combination thereof, and/or a hydrogen source, such as a $H_2$ plasma, $CH_4$ plasma, $CH_3Cl$ plasma, or combination thereof. The first cycle at step 10 may be conducted at a temperature of less than 400° C.

Referring to step 15 of the method depicted in FIG. 1, in some embodiments, the sequence that converts the oxide containing interfacial layer 6 to a binary metal oxide based interlayer 9 may continue with treating the oxide containing interfacial layer with a titanium containing gas precursor and/or a nitrogen plasma and/or a hydrogen plasma in a second cycle. The relative order of precursor exposure might vary, including cycle to cycle. The second cycle follows the first cycle. In some embodiments, the second cycle may produce titanium nitride (TiN), and may include metal gas precursors containing titanium, such as tetrakis(dimethylamino)titanium (TDMAT), titanium tetrachloride ($TiCl_4$) and combinations thereof, and/or a nitrogen source, such as $NH_3$ plasma, $N_2$ plasma or a combination thereof, and or a hydrogen source, such as a $H_2$ plasma, $CH_4$ plasma, $CH_3Cl$ plasma, or combination thereof. The second cycle at step 15 may be conducted at a temperature of less than 400° C.

The first and second cycles depicted at steps 10 and 15 may be alternated multiple times until the oxide containing interfacial layer 6 has been sufficiently converted into a binary metal oxide based interlayer 9 at step 20. For example, the oxide containing interfacial layer 6 may be converted to a binary metal oxynitride interlayer. For example, the sequence of the first and second cycles 10, 15 may be repeated any number of times. In some examples, the first and second cycles 10, 15 may be repeated 2, 5, 10, 15, 20, 25, 50 or 100 times. It some embodiments, the first and second steps 10, 15 may be repeated any number of times that are needed to provide a titanium, aluminum, oxygen and nitrogen, e.g., titanium aluminum oxynitride (TiAlON) layer, having a thickness ranging from 5 Å to 30 Å. In other embodiments, the first and second steps 10, 15 may be repeated to provide a titanium, aluminum, oxygen and nitrogen, e.g., titanium aluminum oxynitride (TiAlON) layer, having a thickness ranging from 10 Å to 20 Å. In other embodiments, the first and second steps 10, 15 may be repeated any number of times that are needed to provide a titanium, aluminum, oxygen and nitrogen, e.g., titanium aluminum oxynitride (TiAlON) layer, having a thickness equal to 15 Å. It is noted that titanium aluminum oxynitride (TiAlON) is only one example of a composition that may be provided by the method of the present disclosure. Other binary metal oxynitrides and binary metal oxide based materials, such as those not including nitrogen, are also within the scope of the structures and methods disclosed herein.

Figure 4:
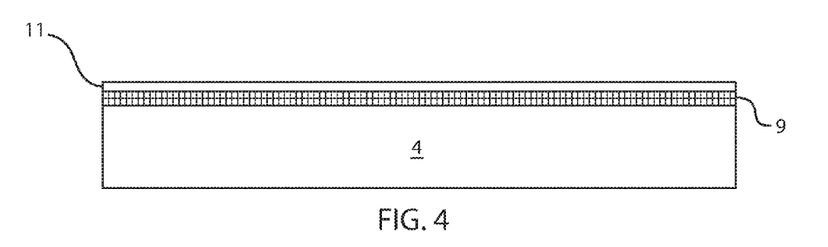
FIG. 4 is a side cross-sectional view depicting forming a high-k dielectric layer atop the binary metal oxide based interlayer, in accordance with one embodiment of the present disclosure.

Following the conversion of the oxide containing interfacial layer 6 into the binary metal oxide based interlayer 9, the method may continue with forming a high-k dielectric layer 11 atop the binary metal oxide based interlayer at step 25 of the process flow illustrated in FIG. 1. The high-k dielectric layer 11 may be deposited directly on the binary metal oxide based interlayer 9, as depicted in FIG. 4, and can in one embodiment be performed in-situ to the binary oxide metal interlayer formation to avoid air exposure and degradation. The term "high-k" denotes a dielectric material having a dielectric constant greater than silicon oxide ($SiO_2$) at room temperature (20° C. to 25° C.) and atmospheric pressure (1 atm). For example, a high-k material may have a dielectric constant greater than 4.0. In another example, the high-k material has a dielectric constant greater than 7.0. In some embodiments, the high-k dielectric layer 11 may be a hafnium containing oxide. One example of a hafnium containing oxide that is suitable for use with the present disclosure is hafnium oxide ($HfO_2$). It is noted that hafnium oxide ($HfO_2$) is not the only material that is suitable for the high-k dielectric layer 11. Examples of such Hf-based dielectrics that are suitable for the high-k dielectric layer 11 may include hafnium oxide ($HfO_2$), hafnium silicate (Hf-$SiO_X$), Hf silicon oxynitride (HfSiON) or multilayers thereof.

Examples of compositions for the high-k dielectric layer 11 that do not include hafnium (Hf) are $ZrO_2$ or rare earth oxides, such as $La_2O_3$. In some embodiments, the high-k dielectric layer may also be composed of $Al_2O_3$, MgO or MgNO. The high-k dielectric layer 11 may have a thickness ranging from about 1.0 Å to about 30.0 Å, e.g., being substantially equal to 25 Å. The high-k dielectric can be composed of more than one layer.

In some embodiments, the high-k dielectric layer 11 may be deposited using atomic layer deposition (ALD). In other embodiments, the high-k dielectric layer 11 may be deposited using chemical vapor deposition (CVD) or atomic layer deposition (ALD). Examples of chemical vapor deposition (CVD) that are suitable for depositing the high-k dielectric layer 11 include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

Figure 5:
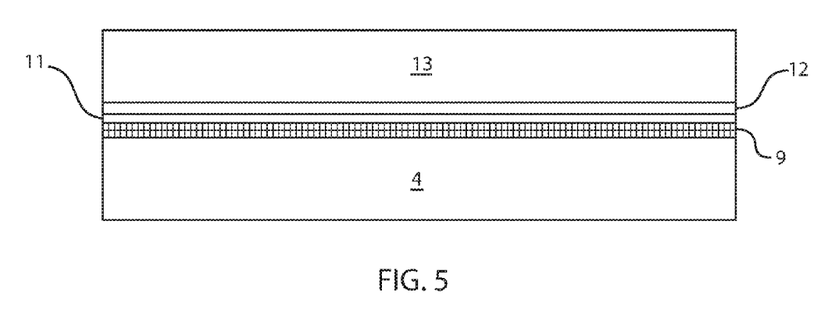
FIG. 5 is a side cross sectional view depicting forming a metal nitride atop the high-k dielectric layer, in accordance with one embodiment of the present disclosure.

Referring to FIGS. 1 and 5, in a follow process step, a metal nitride 12 is formed atop the high-k dielectric layer 11 at step 30. For example, in some embodiments, the metal nitride 12 may be a titanium containing metal nitride, such as titanium nitride (TiN). In some examples, the metal nitride 12 may provide a work function adjustable layer that can be incorporated within a gate structure. For example, when the gate stack includes a metal nitride layer 12 composed of titanium nitride (TiN), stoichiometric tuning can be accomplished by adjusting the titanium (Ti) to nitrogen (N) ratio during the physical vapor deposition (PVD) sputtering program for forming the metal nitride layer 12. In addition to titanium nitride, other compositions are also suitable for use as the metal nitride layer 12. For example, some metal nitrides that can provide work function adjustments may include aluminum (Al), such as aluminum nitride (AlN) and titanium aluminum nitride (TiAlN). In other examples, metal work function adjusting compositions that are suitable for the metal nitride 12 may include other metals from Groups IVB to VIB in the Periodic Table, including, e.g., tantalum nitride (TaN), niobium nitride (NbN), vanadium nitride (VN), tungsten nitride (WN), and combinations thereof. In some embodiments, the metal nitride 12 may be deposited using physical vapor deposition (PVD), such as plating, electroplating, electroless plating, sputtering and combinations thereof. In some embodiments, the metal nitride layer 12 may have a thickness ranging from about 20 Angstroms to about 30 Angstroms. In some embodiments, the metal nitride 12 can be omitted, in which the later described gate electrode 13 is formed directly on the high-k gate dielectric 11.

In some embodiments, a gate electrode 13 may be formed atop the metal nitride 12, as depicted in FIG. 5. The gate electrode 13 may include a doped semiconductor, e.g., n-type doped polysilicon, a metal or a metal nitride, and may be a single layer structure or a multi-layer structure. The gate electrode 13 may be composed of any metal containing material. For example, the gate electrode 13 may be composed of tungsten (W) or a tungsten including alloy. In other examples, the gate electrode 13 is composed of aluminum (Al), copper (Cu), platinum (Pt), silver (Ag) or an alloy thereof including alloys with tungsten (W). The gate electrode 13 may be deposited using physical vapor deposition (PVD), such as plating, electroplating, electroless plating, sputtering and combinations thereof. In other embodiments, the gate electrode 13 may be deposited using chemical vapor deposition (CVD), such as plasma enhanced chemical vapor deposition (PECVD).

Figure 6:
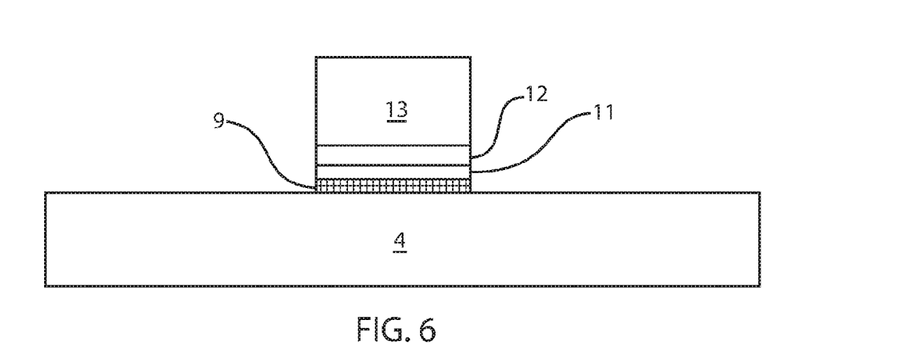
FIG. 6 is side cross-sectional view depicting one embodiment of forming a gate structure including the material stack depicted in FIG. 5.

Referring to FIGS. 1 and 6, the method may progress to step 35, which includes patterning the gate electrode 13, the metal nitride 12, the high-k dielectric layer 11, and the metal oxynitride interlayer 9. FIG. 6 depicts one embodiment of patterning a gate structure 36. The patterned gate structure 36 can be formed utilizing photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. The etch process for patterning the gate structure 36 may include an anisotropic etch, such as reactive ion etching (RIE).

Referring to FIG. 6, the method may continue with forming a gate sidewall spacer 14 on each of the gate structure 36. The gate sidewall spacer 14 may be composed of oxide, i.e., $SiO_2$, but may also comprise nitride or oxynitride materials. The gate sidewall spacer 14 can be formed by deposition and etch processes.

Figure 7:
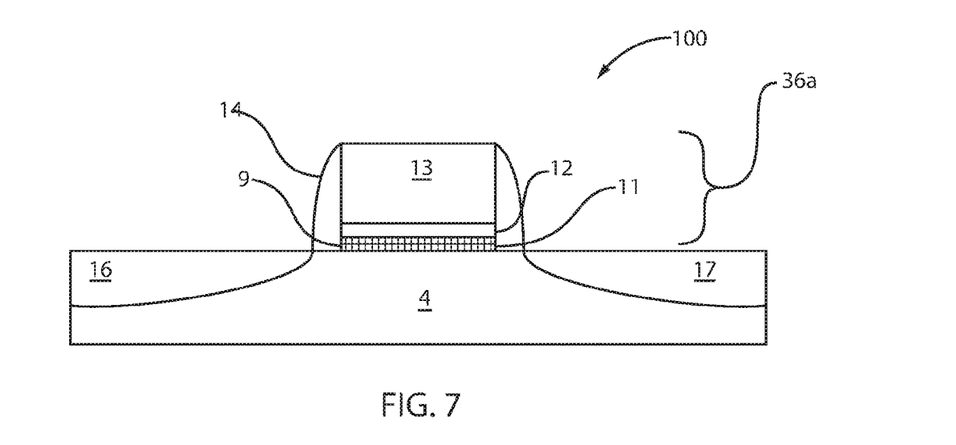
FIG. 7 is a side cross-sectional view depicting forming source regions and drain regions on opposing sides of the channel region, in accordance with one embodiment of the present disclosure.

Following formation of the gate sidewall spacer 14, source regions 16 and drain regions 17 are formed on opposing sides of the channel region, as depicted in FIG. 7. The source regions 16 and drain regions 17 may be formed using ion implantation, in which an n-type or p-type dopant is implanted into the III-V semiconductor substrate 1. In some embodiments, a n-type dopant in a type III-V semiconductor material, such as InGaAs, can be element from Group IIA or VIA of the Periodic Table of Elements). As used herein, "n-type" refers to the addition of impurities that contributes free electrons to an intrinsic semiconductor. As used herein, "p-type" refers to the addition of impurities to an intrinsic semiconductor that creates deficiencies of valence electrons.

Although not depicted in the supplied figures the source and drain regions 16, 17 may further include raised source and drain regions. Raised source and drain regions may include in-situ doped epitaxially formed semiconductor material that is formed on the upper surface of the substrate 1 in which the source and drain regions 16, 17 are present.

In some embodiments, the method described with respect to FIGS. 1-7 can provide a semiconductor device 100 that includes a channel region of a semiconductor substrate 4 composed of a type III-V semiconductor material; and a gate structure 36 that is present atop the channel region including an interlayer 9, i.e., metal oxynitride interlayer 9, composed of aluminum, titanium, oxygen and nitrogen that is present directly on the channel region, a high-k dielectric layer 11 directly atop the interlayer 9, and a metal nitride 12 atop the high-k dielectric layer 11. As described above, the gate structure 36 may also include a gate electrode 13. Source and drain regions 16, 17 may be present on opposing sides of the channel region of the substrate. In some embodiments, the interlayer 9 is composed of titanium aluminum oxynitride (TiAlON), which can have a thickness ranging from 10 Å to 20 Å. In one example, the thickness of the titanium aluminum oxynitride (TiAlON) interlayer 9 is equal to 15 Å.

Figure 8:
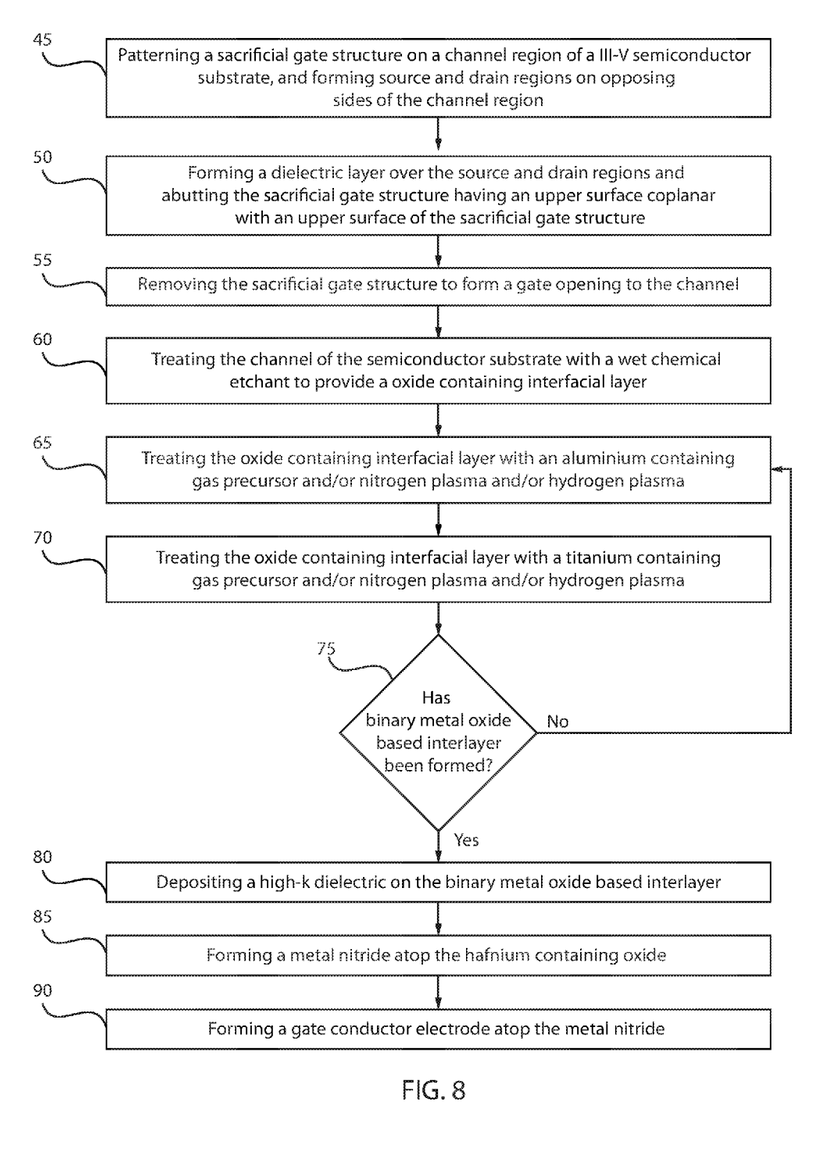
FIG. 8 is a flow chart illustrating one embodiment of a gate last method for forming a semiconductor device that includes a binary metal oxide based interlayer on a III-V semiconductor substrate, in accordance with one embodiment of the present disclosure.

The method depicted in FIGS. 1-7 is a gate first process. The method described with reference to FIGS. 1-7 is equally applicable to a gate last process that employs a sacrificial gate structure prior to forming the source and drain regions, and then replaces the sacrificial gate structure with a functional gate structure after forming the source and drain regions. FIG. 8 is a flow chart illustrating one embodiment of a gate last method for forming a semiconductor device on a III-V semiconductor substrate 4.

Figure 9:
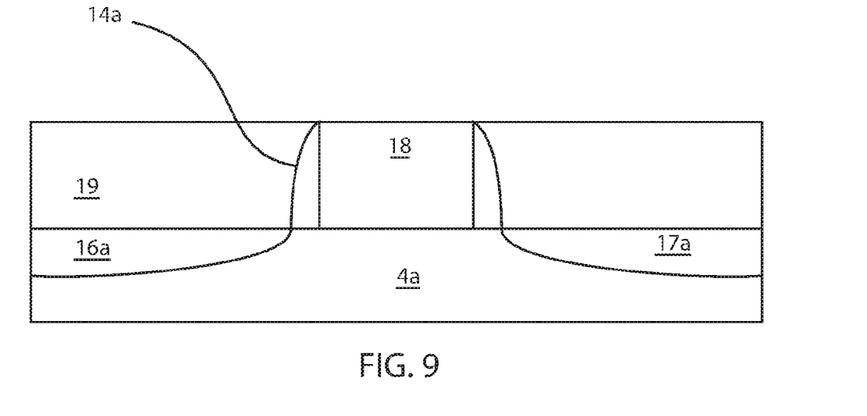
FIG. 9 is a side cross-sectional view depicting forming a sacrificial gate structure on a III-V semiconductor substrate, forming source and drain regions on opposing sides of a channel region of a semiconductor device, and forming a dielectric layer having an upper surface that is coplanar with the sacrificial gate structure.

Referring to FIGS. 8 and 9, the method may begin with forming a sacrificial gate structure 18 on a III-V semiconductor substrate 4a, and forming source and drain regions 16a, 17a on opposing sides of a channel region of a semiconductor device, at step 45. The III-V semiconductor substrate 4a that is depicted in FIG. 9 has been described above with the description of the III-V semiconductor substrate 4 depicted in FIG. 2. For example, the III-V semiconductor substrate 4a may be composed of InGaAs. In some embodiments, the sacrificial gate structures 18 that are depicted in FIG. 9 are formed of a semiconductor material, such as polysilicon. But, in other embodiments, the sacrificial gate structures 18 may be composed of a dielectric material. The sacrificial gate structures 18 may be formed using deposition, photolithography and etching processes. The sacrificial gate structures 18 are formed to have a geometry that matches the geometry of the later formed functional gate structures.

Sidewall spacer 14a are formed on sidewalls of the sacrificial gate structure 18 similar to the sidewall spacer 14 that has been described above with reference to FIG. 7. The above description of the sidewall spacers 14 that are depicted in FIG. 7 is suitable for the description of the sidewall spacer 15a that is depicted in FIG. 9.

The source and drain regions 16a, 17a may be formed using ion implantation. Some examples of the processing and the composition of the source and drain regions 16a, 17a that are depicted in FIG. 9 is provided above with reference to the source and drain regions 16, 17 that are depicted in FIG. 7. For example, the source and drain regions 16a, 17a depicted in FIG. 9 may be formed using ion implantation of n-type or p-type dopants.

Referring to FIGS. 8 and 9, following formation of the source and drain regions 16a, 17a, a dielectric layer 19 may be formed having an upper surface that is coplanar with the sacrificial gate structure 18 at step 50. The dielectric layer 19 may be deposited using chemical solution deposition, spin on deposition, chemical vapor deposition or a combination thereof. The dielectric layer 19 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. Following deposition, the dielectric layer 19 may be planarized to provide an upper surface that is coplanar with an exposed upper surface of the sacrificial gate structures 18. In one example, the planarization process is chemical mechanical planarization (CMP).

Figure 10:
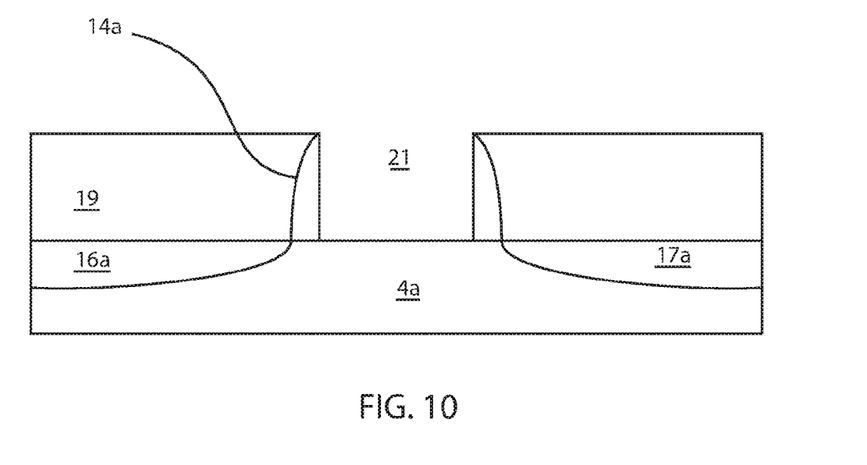
FIG. 10 is a side cross-sectional view depicting removing the sacrificial gate structure to provide a gate opening to the channel region of the semiconductor device, in accordance with one embodiment of the present disclosure.

Referring to FIGS. 8 and 10, at step 55, the method may continue with removing the sacrificial gate structure 18 to provide a gate opening to the channel region of the semiconductor device. The sacrificial gate structures 18 may be removed using a selective etch process.

Figure 11:
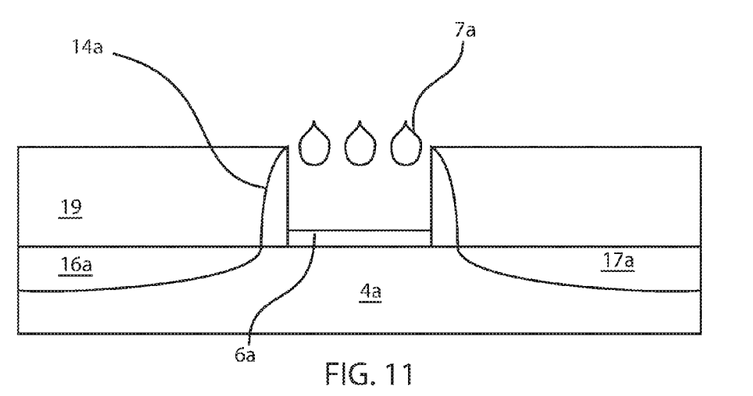
FIG. 11 is a side cross-sectional view depicting one embodiment of applying a wet chemical etch to a III-V semiconductor channel region of a substrate to form an oxide containing interfacial layer in the gate opening depicted in FIG. 10, in accordance with the present disclosure.

Referring to FIGS. 8 and 11, the method may continue with step 60 which includes treating a semiconductor substrate 4 with a wet etch chemistry to provide a oxide containing interfacial layer 6a. The oxide containing interfacial layer 6a that is depicted in FIG. 11 has been described above with the description of the oxide containing interfacial layer 6 depicted in FIG. 2. For example, the interfacial oxide material 6a may include arsenic oxide. It is noted that arsenic oxide is only one example of the interfacial oxide material 6a that can be used at this step of the present disclosure, and it is not intended that the interfacial oxide material 6a be limited to only this example. The interfacial oxide material 6a may be formed by applying a wet chemical etchant 7a to the surface of the semiconductor substrate 4a. The wet chemical etchant 7a that is depicted in FIG. 11 has been described above with the description of the wet chemical etchant 7 depicted in FIG. 2. For example, the wet chemical etchant may include hydrochloric acid (HCl), ammonium hydroxide (NH4OH), or a buffered oxide etch (BOE). In one embodiment, treating the semiconductor substrate 4a with the wet chemical etchant may include a two stage treatment including a first surface treatment with ammonium hydroxide (NH$_4$OH) followed by a second surface treatment with ammonium sulfide (NH$_4$)$_2$S.

The wet chemical etchant 7a may be applied to the channel region of the semiconductor substrate 4a through the gate opening that is formed by removing the sacrificial gate structure 18. The wet chemical etchant 7a may be applied at room temperature, e.g., 20° C. to 25° C., or the wet chemical etchant 7a may be applied at an elevated temperature, which can be as great as about 400° C. Further details regarding the process for applying the wet chemical etchant 7a have been provided above in the description of FIG. 2. In some embodiments, the thickness of the interfacial oxide material 6a may range from 1 Å to 10 Å. The interfacial oxide material 6a may have a poor quality.

Figure 12:
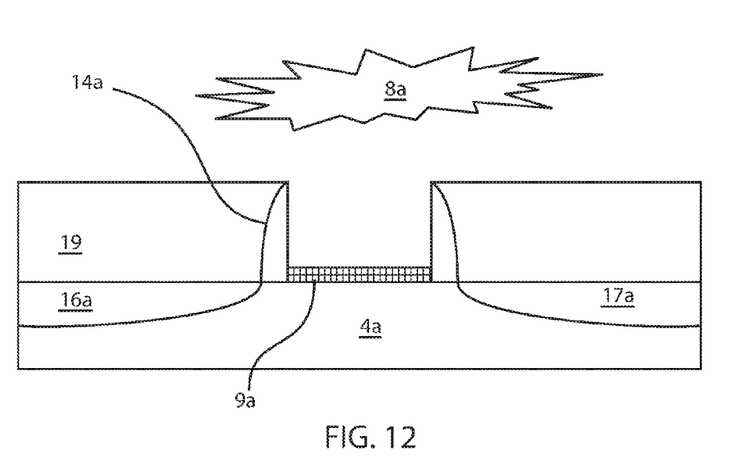
FIG. 12 is a side cross-sectional view depicting one embodiment of converting the oxide containing interfacial layer to a binary metal oxide based interlayer using a plasma deposition sequence including alternating a metal gas precursor and a plasma including nitrogen, hydrogen or a combination thereof, in accordance with one embodiment of the present disclosure.

Referring to FIG. 8, in a following sequence of steps, the interfacial oxide material 6a may be converted from a poor interfacial layer into a high quality binary metal oxide based interlayer 9a for high mobility channels by employing alternating supercycles of at least one of metals, metal nitrides and nitrogen sources in accordance with steps 65, 70 and 75. FIG. 12 depicts one embodiment of converting the interfacial oxide material 6a that is present within the gate opening to a binary metal oxide based interlayer 9a using a plasma including deposition 8a including alternating a metal gas precursor for a metal source and a plasma of nitrogen containing plasma species, hydrogen containing plasma species or a combination of hydrogen and nitrogen containing plasma species. In some embodiments, a nitrogen containing plasma may provide a nitrogen source in forming a binary metal oxide based interlayer 9a that is a metal oxynitride. In one embodiment, the high quality binary metal oxide based interlayer 9a is composed of an aluminum, titanium and nitrogen containing composition. For example, the high quality binary metal oxide based interlayer 9a may be composed of titanium aluminum oxynitride (TiAlON).

Similar to the method described with reference to FIGS. 1 and 3, the conversion of the interfacial oxide material 6a to the high quality binary metal oxide based interlayer 9a may begin with placing the structure depicted in FIG. 11 in the deposition chamber of an atomic layer deposition (ALD) apparatus that may include a remote plasma producing chamber. In some embodiments, the ALD apparatus used to form the binary metal oxide based interlayer 9 may include a plasma source that is remote from the deposition chamber for providing a nitrogen source or a hydrogen source.

Referring to steps 65 and 70 of the method depicted in FIG. 8, in some embodiments, the sequence employed that converts the oxide containing interfacial layer 6a to a binary metal oxide based interlayer 9a includes alternating different metal gas precursor and a plasma including nitrogen based species, hydrogen based species or a combination of nitrogen and hydrogen based species.

Referring to step 65 of the method depicted in FIG. 8, in some embodiments, the sequence that converts the oxide containing interfacial layer 6a to a binary metal oxide based interlayer 9a may begin with treating the oxide containing interfacial layer with an aluminum containing gas precursor and a plasma of nitrogen, hydrogen or combination including nitrogen and hydrogen in a first cycle. The first cycle may produce aluminum nitride (AlN), and may include metal gas precursors containing aluminum, such as trimethyl aluminum (TMA), triethylaluminium (TEAL) or a combination thereof, and/or a nitrogen source, such as NH$_3$ plasma, N$_2$ plasma or a combination thereof, and/or a hydrogen source, such as a H$_2$ plasma, CH$_4$ plasma, CH$_3$Cl plasma, or combination thereof. The first cycle at step 65 may be conducted at a temperature of less than 400° C.

Referring to step 70 of the method depicted in FIG. 2, in some embodiments, the sequence that converts the oxide containing interfacial layer 6 to a binary metal oxide based interlayer 9a may continue with treating the oxide containing interfacial layer with a titanium containing gas precursor and a plasma in a second cycle. The second cycle follows the first cycle. In some embodiments, the second cycle may produce titanium nitride (TiN), and may include metal gas precursors containing titanium, such as tetrakis(dimethylamino)titanium (TDMAT), titanium tetrachloride (TiCl$_4$) and combinations thereof, and/or a nitrogen source, such as NH$_3$ plasma, N$_2$ plasma or a combination thereof, and/or a hydrogen source, such as a H$_2$ plasma, CH$_4$ plasma, CH$_3$Cl plasma, or combination thereof. The second cycle at step 70 may be conducted at a temperature of less than 400° C.

The first and second cycles depicted at steps 65 and 70 may be alternated multiple times until the oxide containing interfacial layer 6a has been sufficiently converted into a binary metal oxide based interlayer 9a at step 75. For example, the sequence of the first and second cycles 65, 70 may be repeated any number of times. In some embodiments, the first and second steps 65, 70 may be repeated any number of times that are needed to provide a titanium, aluminum, oxygen and nitrogen, e.g., titanium aluminum oxynitride (TiAlON) layer, having a thickness ranging from 5 Å to 30 Å. In other embodiments, the first and second steps 65, 70 may be repeated to provide a titanium, aluminum, oxygen and nitrogen, e.g., titanium aluminum oxynitride (TiAlON) layer, having a thickness ranging from 10 Å to 20 Å. In other embodiments, the first and second steps 10, 15 may be repeated any number of times that are needed to provide a titanium, aluminum, oxygen and nitrogen, e.g., titanium aluminum oxynitride (TiAlON) layer, having a thickness equal to 15 Å. It is noted that titanium aluminum oxynitride (TiAlON) is only one example of a composition that may be provided by the method of the present disclosure. Other binary metal oxynitrides and binary metal oxide based materials, such as those not including nitrogen, are also within the scope of the structures and methods disclosed herein.

Figure 13:
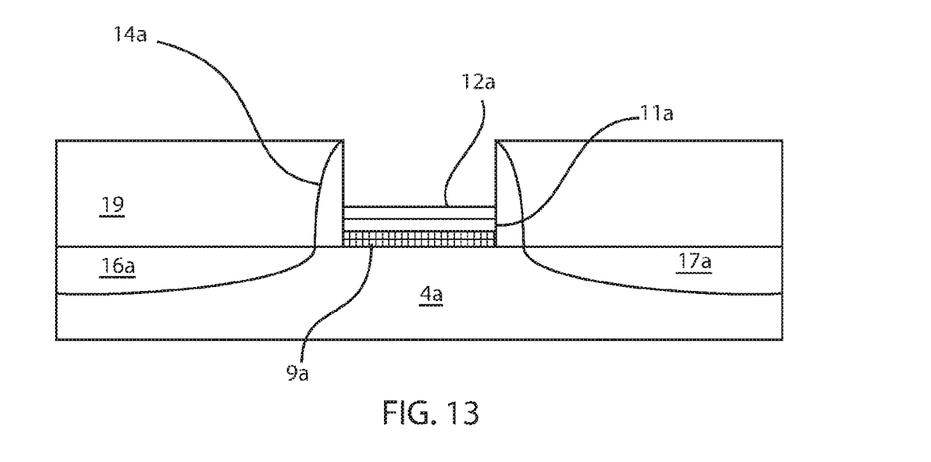
FIG. 13 is a side cross-sectional view depicting forming a high-k dielectric layer atop the binary metal oxide based interlayer that is depicted in FIG. 12, in accordance with one embodiment of the present disclosure.

Referring to FIGS. 8 and 13, following the conversion of the oxide containing interfacial layer 6a into the binary metal oxide based interlayer 9a, the method may continue with forming a high-k dielectric layer 11a atop the binary metal oxide based interlayer at step 80. The high-k dielectric layer 11a may be deposited directly on the binary metal oxide based interlayer 9a, as depicted in FIG. 8. The high-k dielectric layer 11a and its method of formation have been described above with reference to FIGS. 1 and 4. For example, the high-k dielectric layer 11a may be composed of hafnium oxide ($HfO_2$).

Referring to FIGS. 8 and 13, the method may continue with forming a metal nitride 12a atop the high-k dielectric layer 11a at step 85. The metal nitride 12a depicted in FIG. 13 is similar to the metal nitride 12 that is depicted in FIG. 5. Therefore, in some embodiments, the description of the metal nitride 12 and its method of formation, as described with reference to FIG. 5, is suitable for providing a description of some embodiments of the metal nitride 12a that is depicted in FIG. 13. In some embodiments, the metal nitride 12a can be omitted, in which the later described gate electrode 13a is formed directly on the high-k gate dielectric 11a.

Figure 14:
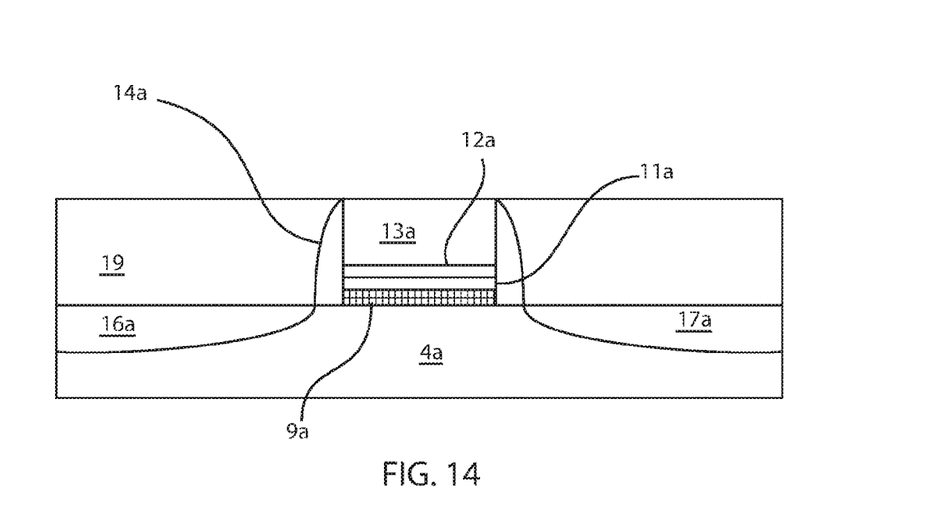
FIG. 14 is a side cross sectional view depicting forming a metal nitride atop the high-k dielectric layer, in accordance with one embodiment of the present disclosure.

The method may continue with step 90 of FIG. 8 with forming a gate electrode 13a on the metal nitride 12a, as depicted in FIG. 14. The gate electrode 13a depicted in FIG. 14 is similar to the gate electrode 13 that is depicted in FIG. 5. Therefore, in some embodiments, the description of the gate electrode 13 and its method of formation, as described with reference to FIG. 5, is suitable for providing a description of some embodiments of the gate electrode 13a that is depicted in FIG. 14.

Figure 15A:
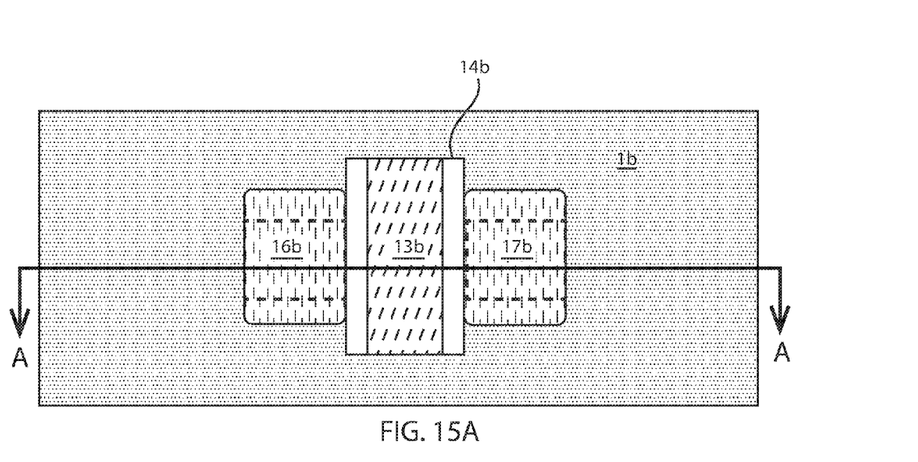
FIG. 15A is a top down view of a fin field effect transistor having a gate structure formed in accordance with the present disclosure.
Figure 15B:
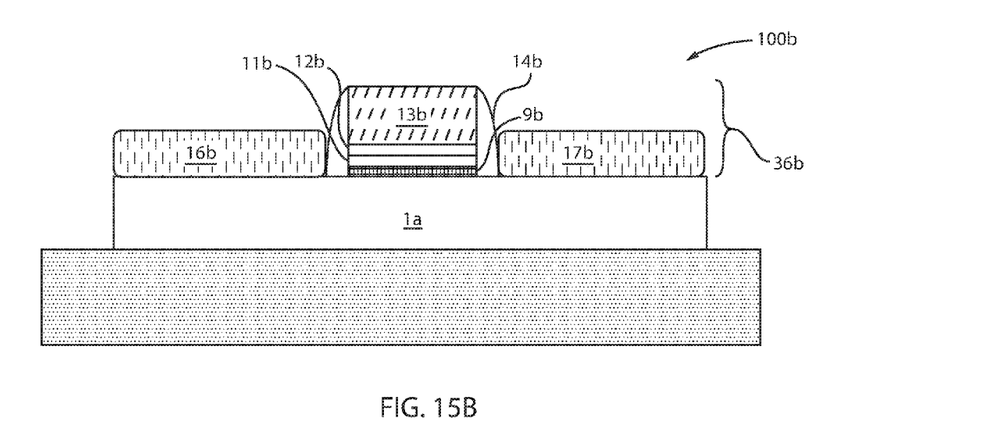
FIG. 15B is a side cross-sectional view along section line A-A of FIG. 15A.

Although the structures depicted in the supplied drawings depicted in FIGS. 1-14 are planar devices, the present disclosure is not limited to only this example. For example, the methods disclosed herein may be suitable for forming gate structures to FinFET devices, as depicted in FIGS. 15a and 15b. FinFET devices are field effect transistors in which the channel is present in a fin structure 1a. As used herein, a "fin structure" refers to a semiconductor material, which is employed as the body of a semiconductor device, in which the gate structure is positioned around the fin structure such that charge flows down the channel on the two sidewalls of the fin structure 1a and optionally along the top surface of the fin structure 1a. In some embodiments, a fin structure may have a height ranging from 5 nm to 200 nm. In another embodiment, the fin structure may have a height ranging from 10 nm to 100 nm. In some embodiments, the fin structures may have a width of less than 20 nm. In another embodiment, each of the fin structures has a width ranging from 3 nm to 8 nm. The methods described with reference to FIGS. 1 and 8 may employ a fin structure 1a that is composed of a type III-V semiconductor material. The fin structure 1a may be present atop a supporting substrate 1b, which may be a dielectric material. The gate structure 36b depicted in FIGS. 15A and 15B may include a binary metal oxide based interlayer 9b, composed of aluminum, titanium, oxygen and nitrogen (nitrogen may be optional) that is present directly on the channel region, a high-k dielectric layer 11b directly atop the interlayer 9b, and a metal nitride 12b atop the high-k dielectric layer. The gate structure may also include a gate electrode 23b. The multiple layers of the gate structure 35b that are depicted in FIGS. 15A and 15B have been described above with reference to FIGS. 1-14. The source and drain regions 16b, 17b that are depicted in FIGS. 15A and 15B have been described above with reference to FIGS. 1-14.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a gate stack comprising:
    treating a semiconductor fin structure with a wet etch chemistry to clean a surface of the semiconductor fin structure and form an oxide containing interfacial layer on the surface of the semiconductor fin structure;
    converting the oxide containing interfacial layer to a binary alloy oxide based interlayer using a plasma deposition sequence including alternating a metal gas precursor and a plasma selected from the group consisting of hydrogen, nitrogen or a combination thereof; and
    forming a high-k dielectric layer atop the binary alloy oxide-based interlayer.

2. The method of claim 1, wherein the semiconductor fin structure comprises a III-V semiconductor substrate.

3. The method of claim 1, wherein the wet etch chemistry is selected from the group consisting of ammonium fluoride ($NH_4F$), hydrofluoric acid (HF), hydrochloric acid (HCl), ammonium hydroxide ($NH_4OH$), ammonium sulfide ($NH_4$)$_2$S and combinations thereof.

4. The method of claim 1, wherein the treating of the semiconductor substrate with the wet etchant chemistry comprises a two stage treatment including a first surface treatment with ammonium hydroxide ($NH_4OH$) followed by a second surface treatment with ammonium sulfide $(NH_4)_2S$.

5. The method of claim 1, wherein the converting the oxide containing interfacial layer to a binary oxide based alloy using a plasma deposition sequence including alternating a metal gas precursor and the plasma employs an atomic layer deposition (ALD) apparatus.

6. The method of claim 5, wherein the binary alloy oxide based interlayer comprises aluminum, titanium, oxygen and nitrogen.

7. The method of claim 6, wherein the binary alloy oxide based interlayer comprises aluminum, titanium and oxygen.

8. The method of claim 7, wherein the binary alloy oxide based interlayer is titanium aluminum oxynitride (TiAlON).

9. The method of claim 5, wherein the metal gas precursor comprises an aluminum precursor selected from the group consisting of trimethyl aluminum (TMA), triethylaluminium (TEAL) or a combination thereof.

10. The method of claim 5, wherein the metal gas precursor comprises a titanium precursor selected from the group consisting of tetrakis(dimethylamino)titanium (TDMAT), titanium tetrachloride ($TiCl_4$) and combinations thereof.

11. The method of claim 5, wherein the metal gas precursor comprises a cycle of aluminum containing precursors and titanium containing precursors.

12. The method of claim 5, wherein the nitrogen species of the plasma is selected from the group consisting of $NH_3$ plasma, $N_2$ plasma and a combination thereof.

13. The method of claim 5, wherein the hydrogen species of the plasma is selected from the group consisting of $CH_4$, $H_2$, $CH_3Cl$ and a combination thereof.

14. The method of claim 12, wherein the nitrogen containing plasma is generated remotely from a deposition chamber of an atomic layer deposition apparatus in which the oxide containing interfacial layer is converted to the oxide based binary alloy.

15. The method of claim 1, wherein the converting the oxide containing interfacial layer to the oxide based binary alloy using the plasma deposition sequence including alternating the metal gas precursor and the nitrogen containing plasma is conducted at a temperature of 400° C. or less.

* * * * *